(12) United States Patent
Chuang et al.

(10) Patent No.: US 9,275,726 B2
(45) Date of Patent: Mar. 1, 2016

(54) STATIC MEMORY CELL

(71) Applicant: Faraday Technology Corp., Hsin-Chu (TW)

(72) Inventors: Ching-Te Chuang, New Taipei (TW);
Chih-Hao Chang, Yunlin County (TW);
Chao-Kuei Chung, Taichung (TW);
Chien-Yu Lu, Hsinchu (TW); Shyh-Jye Jou, Hsinchu County (TW); Ming-Hsien Tu, Hsinchu (TW)

(73) Assignee: Faraday Technology Corp.,
Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/200,040

(22) Filed: Mar. 7, 2014

(65) Prior Publication Data

US 2015/0162077 A1 Jun. 11, 2015

(30) Foreign Application Priority Data

Dec. 10, 2013 (TW) .............................. 102145452 A

(51) Int. Cl.
*G11C 11/00* (2006.01)
*G11C 11/419* (2006.01)
*G11C 11/412* (2006.01)
*G11C 11/413* (2006.01)

(52) U.S. Cl.
CPC ............ *G11C 11/419* (2013.01); *G11C 11/412* (2013.01); *G11C 11/413* (2013.01)

(58) Field of Classification Search
CPC ....................................................... G11C 11/419
USPC ................................................... 365/154, 156
See application file for complete search history.

(56) References Cited

U.S. PATENT DOCUMENTS

| | | | |
|---|---|---|---|
| 6,940,746 B2 * | 9/2005 | Kushida | 365/154 |
| 7,324,368 B2 | 1/2008 | Wang et al. | |
| 7,596,012 B1 | 9/2009 | Su et al. | |
| 7,952,910 B2 * | 5/2011 | Lih et al. | 365/154 |
| 7,957,176 B2 * | 6/2011 | Otsuka | 365/154 |
| 8,320,164 B2 | 11/2012 | Chuang et al. | |
| 8,441,842 B2 * | 5/2013 | Rachamadugu et al. | 365/154 |
| 8,520,429 B2 * | 8/2013 | Behrends et al. | 365/154 |
| 8,659,936 B2 * | 2/2014 | Chuang et al. | 365/154 |
| 2012/0170388 A1 | 7/2012 | Choi | |
| 2012/0281457 A1 | 11/2012 | Behrends et al. | |

* cited by examiner

*Primary Examiner* — Son Mai
(74) *Attorney, Agent, or Firm* — Winston Hsu; Scott Margo

(57) ABSTRACT

A static memory cell is provided. The static memory cell includes a data latch circuit and a voltage provider. The data latch circuit is configured to store a bit data. The data latch circuit has a first inverter and a second inverter, and the first inverter and the second inverter are coupled to each other. The first inverter and the second inverter respectively receive a first voltage and a second voltage as power voltages. The voltage provider provides the first voltage and the second voltage to the data latch circuit. When the bit data is written to the data latch circuit, the voltage provider adjusts a voltage value of one of the first and second voltages according to the bit data.

16 Claims, 8 Drawing Sheets

STATIC MEMORY CELL

CROSS-REFERENCE TO RELATED APPLICATION

This application claims the priority benefit of Taiwan application serial no. 102145452, filed on Dec. 10, 2013. The entirety of the above-mentioned patent application is hereby incorporated by reference herein and made a part of this specification.

BACKGROUND OF THE INVENTION

1. Field of the Invention

The invention generally relates to a static memory cell.

2. Description of Related Art

A static memory is a static random access memory familiar to people. In the related art, a static memory cell included in the static memory has a latch circuit constructed by a circuit structure with two inverters, and the latch circuit performs a storage function by latching a bit data.

With the advance in technologies of manufacturing processes, it is difficult or even impossible to write the bit data into the static memory cell of the existing static memory in the integrated circuit formed by performing a nano-scale manufacturing process because of the process parameter drift. Accordingly, providing a drift-tolerant and fast static memory into which the bit data may be stably written is one of the important topics to designers skilled in the pertinent art.

SUMMARY OF THE INVENTION

Accordingly, an embodiment of the invention provides a plurality of static memory cells to effectively improve the data writing capability.

In an embodiment of the invention, a static memory cell that includes a data latch circuit and a voltage provider is provided. The data latch circuit is configured to store bit data. The data latch circuit has a first inverter and a second inverter coupled to each other. The first inverter and the second inverter receive respectively a first voltage and a second voltage as power voltages. The voltage provider is coupled to the data latch circuit to provide the first voltage and the second voltage to the data latch circuit. Here, the voltage provider adjusts the voltage value of one of the first voltage and the second voltage according to the bit data while the bit data is written into the data latch circuit.

In another embodiment of the invention, invention a static memory cell that includes a data latch circuit, a first voltage provider, and a second voltage provider is provided. The data latch circuit is configured to store a bit data, the data latch circuit has a first inverter and a second inverter coupled to each other, the first inverter and the second inverter receive respectively a first voltage and a second voltage as operating voltages, and the first inverter and the second inverter further receive the third voltage and the fourth voltage as reference ground voltages. The first voltage provider is coupled to the data latch circuit to provide the first voltage and the second voltage to the data latch circuit. The second voltage provider is coupled to the data latch circuit to provide the third voltage and the fourth voltage to the data latch circuit. Here, the voltage provider adjusts the voltage values of the first voltage and the fourth voltage or the voltage values of the second voltage and the third voltage according to the bit data when the bit data is written into the data latch circuit.

In yet another embodiment of the invention, a static memory cell that includes a data latch circuit and a voltage provider is provided. The data latch circuit is configured to store a bit data, the data latch circuit has a first inverter and a second inverter coupled to each other, and the first and second inverters receive an output voltage as an operating voltage. The voltage provider is coupled to the data latch circuit and provides the output voltage. The voltage provider includes a tri-state inverter and a switch. The output end of the tri-state inverter is coupled to the input end of the tri-state inverter so as to be coupled to the output end of the voltage provider, the output end of the voltage provider provides the output voltage to the data latch circuit, and the tri-state inverter is controlled by a voltage providing enabling signal. The switch is connected serially between the data latch circuit and the power operating voltage, and the switch is turned on or off according to whether the data latch circuit performs data writing operation or not.

Based on the above, in an embodiment of the invention, the power voltage received by one of the two inverters in the static memory cell is adjusted in accordance with the bit data intended to be written. In the static memory cell provided in another embodiment of the invention, the operating voltage of the data latch circuit may be appropriately adjusted when the data are written into the static memory cell by using a tri-state inverter of which the input end and the output end are coupled to each other. Therefore, the speed at which the bit data is written into the static memory cell may be improved effectively, and the data writing capability can also be enhanced. Even in the event of the process parameter drift, the bit data writing capability of the static memory cell is not affected. Thereby, the data storage performance of the static memory cell may be effectively enhanced.

In order to make the aforementioned and other features and advantages of the invention more comprehensible, several embodiments accompanied with figures are described in detail below.

DESCRIPTION OF THE EMBODIMENTS

Figure 1:
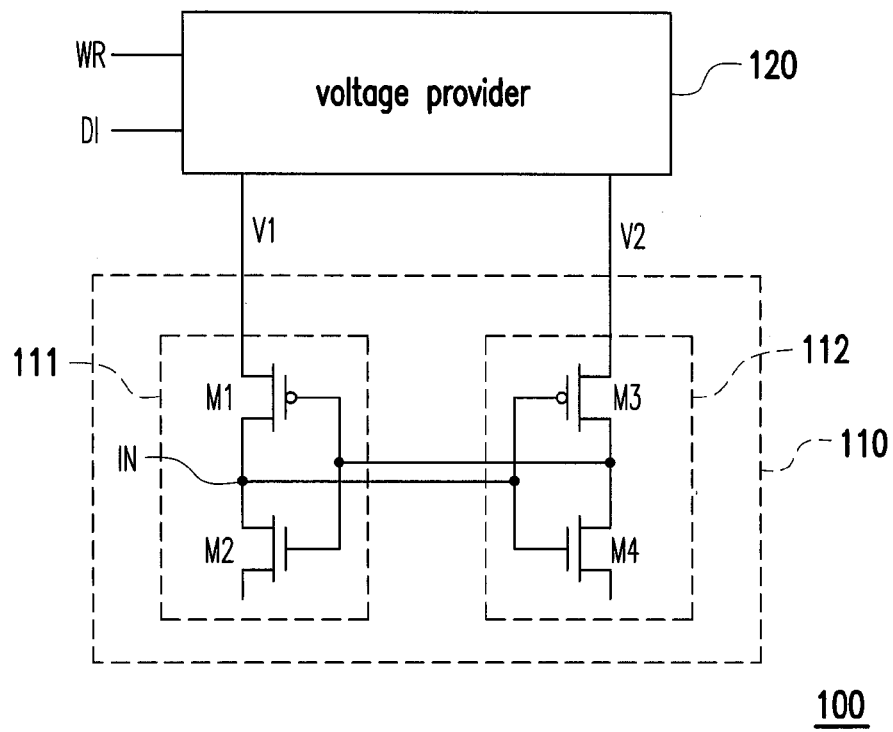
FIG. 1 is a schematic diagram illustrating a static memory cell 100 according to an embodiment of the invention.

FIG. 1 is a schematic diagram illustrating a static memory cell 100 according to an embodiment of the invention. The static memory cell 100 includes a data latch circuit 110 and a voltage provider 120. The data latch circuit 110 is configured to store a bit data DI. The data latch circuit 110 has an inverter 111 and an inverter 112 coupled to each other, the input end of the inverter 111 is coupled to the output end of the inverter 112, and the output end of the inverter 111 is coupled to the input end of the inverter 112. The inverter 111 is constructed by transistors M1 and M2, and the inverter 112 is constructed by transistors M3 and M4. The inverter 111 and the inverter 112 respectively receive the first voltage V1 and the second voltage V2 as power voltages.

The voltage provider 120 is coupled to terminals of the inverter 111 and the inverter 112 of the data latch circuit 110, and the terminals of the inverter 111 and the inverter 112 are used to receive the power voltages thereof. The voltage provider 120 generates the first voltage V1 and the second voltage V2 and provides the first voltage V1 and the second voltage V2 respectively to the inverter 111 and the inverter 112 of the data latch circuit 110. In the present embodiment, the inverter 111 and the inverter 112 of the data latch circuit 110 respectively receive the voltages V1 and V2 as power operating voltages.

The voltage provider 120 adjusts the voltage value of the first voltage V1 or that of the second voltage V2 according to the bit data DI when the bit data DI is written into the data latch circuit 110. In details, the voltage provider 120 determines whether the bit data is written into the data latch circuit 110 or not by means of a write-in signal WR. Once the write-in signal WR indicates that the bit data DI is written into the data latch circuit 110, the voltage provider 120 may adjust the voltage value of the first voltage or that of the second voltage according to the logic high or low level of the bit data DI.

Further, the voltage values of the first voltage V1 and the second voltage V2 provided by the voltage provider 120 are equal to the voltage value of the power operating voltage VDD when the static memory cell 100 does not perform data writing. When the bit data DI is written into the static memory cell 100 through the terminal IN, and the bit data DI is at a logic low level, the voltage provider 120 may adjust the first voltage V1 to decrease the voltage value of the first voltage V1 from the value of the power operating voltage VDD to a lower voltage value; at this time, the voltage value of the second voltage V2 stays unchanged. By contrast, when the bit data DI is written into the static memory cell 100, and the bit data DI is at a logic high level, the voltage provider 120 can adjust the second voltage V2 to decrease the voltage value of the second voltage V2 from the value of the power operating voltage VDD to a lower voltage value; at this time, the voltage value of the first voltage V1 is kept to be equal to the value of the power operating voltage VDD.

From the mentioned above, the bit data DI can be written into the latch loop constructed by the inverter 111 and the inverter 112 more easily through decreasing the operating voltage received by one of the two inverters 111 and 112 of the data latch circuit 110. Besides, after finishing the write-in operation of the bit data DI, the voltage provider 120 can recover the voltage values of the first voltage V1 and the second voltage V2 provided by the voltage provider 120 to be equal to the voltage value of the power operating voltage VDD. Therefore, the data latch circuit 110 can effectively latch the newly written bit data.

Figure 2:
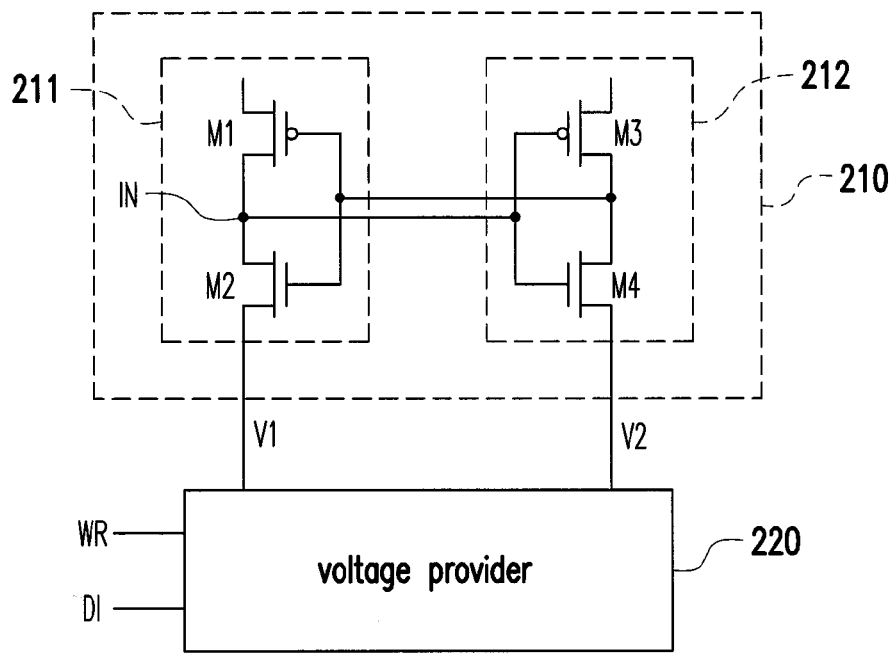
FIG. 2 is a schematic diagram illustrating a static memory cell 200 according to another embodiment of the invention.

FIG. 2 is a schematic diagram illustrating a static memory cell according to another embodiment of the invention. The static memory cell 200 includes a data latch circuit 210 and a voltage provider 220. The data latch circuit 210 has an inverter 211 and an inverter 212, the input end of the inverter 211 is coupled to the output end of the inverter 212, and the output end of the inverter 211 is coupled to the input end of the inverter 212. The inverter 211 is constructed by a transistor M1 and a transistor M2, and the inverter 212 is constructed by a transistor M3 and a transistor M4.

The difference between the embodiment depicted in FIG. 1 and the embodiment shown in FIG. 2 is that the first voltage V1 and the second voltage V2 generated by the voltage provider 220 of the static memory cell 200 are provided as the reference ground voltages of the inverter 211 and inverter 212, respectively. When the bit data DI is written into the data latch circuit 210, the voltage provider 220 can adjust the voltage value of the first voltage V1 or the voltage value of the second voltage V2 according to the write-in signal WR and the logic level of the bit data DI.

For instance, in case that the bit data DI is not written, the voltage provider 220 provides the first voltage V1 and the second voltage V2 whose values are equal to the voltage value of the power ground voltage VSS. When the bit data DI is written into the data latch circuit 210 through the terminal IN, and the bit data DI is at a logic high level, the voltage provider 220 can increase the voltage value of the first voltage V1; at this time, the voltage value of the second voltage V2 is equal to the voltage value of the reference ground voltage VSS. By contrast, when the bit data DI is written into the data latch circuit 210 through the terminal IN, and the bit data DI is at a logic low level, the voltage provider 220 can increase the voltage value of the second voltage V2; at this time, the voltage value of the first voltage V1 is equal to the voltage value of the reference ground voltage VSS at the moment. Similar to the embodiment shown in FIG. 1, the bit data can be written into the data latch circuit 210 more rapidly and effectively through adjusting the reference ground voltages received by the inverter 211 and the inverter 212 of the data latch circuit 210.

Figure 3:
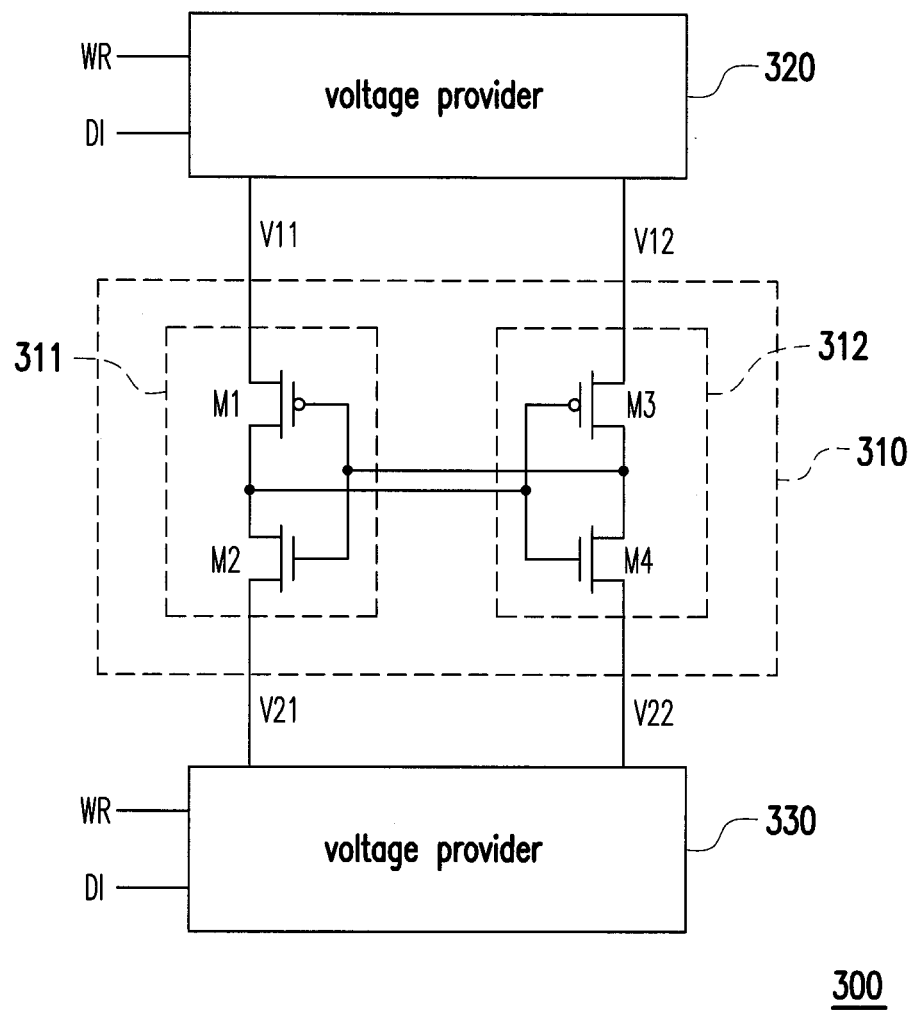
FIG. 3 is a schematic diagram illustrating a static memory cell 300 according to yet another embodiment of the invention.

FIG. 3 is a schematic diagram illustrating a static memory cell 300 according to yet another embodiment of the invention. The static memory cell 300 includes a data latch circuit 310, a voltage provider 320, and a voltage provider 330. The data latch circuit 310 includes an inverter 311 and an inverter 312, the input end of the inverter 311 is coupled to the output end of the inverter 312, and the output end of the inverter 311 is coupled to the input end of the inverter 312. The voltage provider 320 and the voltage provider 330 are coupled to the data latch circuit 310, respectively. The voltage provider 320 generates a first voltage V11 and a second voltage V12 respectively as the operating voltages of the inverter 311 and the inverter 312. The voltage provider 330 generates a third voltage V21 and a fourth voltage V22 respectively as the reference ground voltages of the inverter 311 and the inverter 312.

When the bit data DI equal to a logic high level is written into the data latch circuit 310, the voltage provider 320 and the voltage provider 330 can decrease the voltage values of the voltage V12 and increase the voltage value of the voltage V21 respectively, such that the bit data DI is written into the data latch circuit 310 more readily. By contrast, when the bit data DI equal to a logic low level is written into the data latch circuit 310, the voltage provider 320 and the voltage provider 330 can decrease the voltage value of the voltage V11 and increase the voltage value of the voltage V22 respectively, such that the bit data DI is written into the data latch circuit 310 more readily.

Figure 4A:
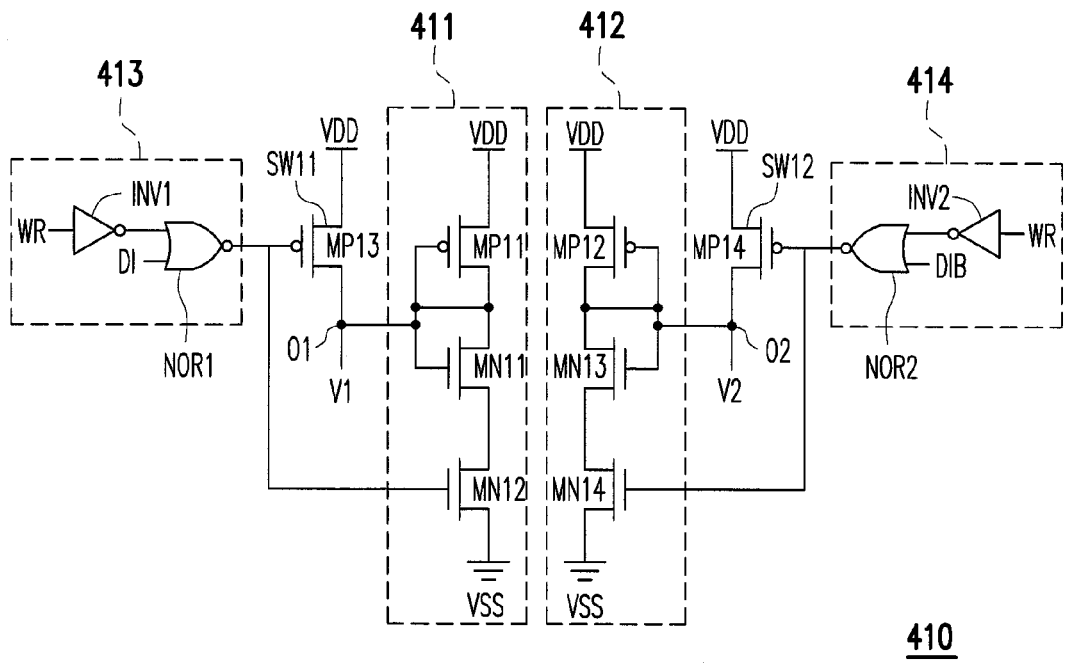
FIG. 4A is a schematic diagram illustrating a manner to implement a voltage provider 410 according to an embodiment of the invention.

FIG. 4A is a schematic diagram illustrating a manner to implement a voltage generator 410 according to an embodiment of the invention. The voltage generator 410 includes a tri-state inverter 411, a tri-state inverter 412, a switch SW11, a switch SW12, a logic operation circuit 413, and a logic operation circuit 414. The tri-state inverter 411 includes three transistors MP11, MN11, and MN12. The control ends of the transistors MP11 and MN11 are coupled to each other to construct the input end of the tri-state inverter 411, and the second end of the transistor MP11 and the first end of the transistor MN11 are coupled to each other to construct the output end of the tri-state inverter 411. The control end of the transistor MN12 constructs the control end of the tri-state inverter 411. Note that the input end and the output end of the tri-state inverter 411 are coupled to each other, and the input end and the output end of the tri-state inverter 411 are both connected to the first output end O1. Here, the first output end O1 is configured to provide the first voltage V1.

The tri-state inverter 412 includes three transistors MP12, MN13, and MN14. The control ends of the transistors MP12 and MN13 are coupled to each other to construct the input end of the tri-state inverter 412, and the second end of the transistor MP12 and the first end of the transistor MN13 are coupled to each other to construct the output end of the tri-state inverter 412. The control end of the transistor MN14 constructs the control end of the tri-state inverter 412. Similar to the tri-state inverter 411, the input end and the output end of the tri-state inverter 412 are coupled to each other, and the input end and the output end of the tri-state inverter 412 are both connected to the second output end O2. Here, the second output end O2 is configured to provide the second voltage V2.

Besides, the first end of the transistor MN12 is coupled to the second end of the transistor MN11, and the second end of the transistor MN12 is coupled to the power ground voltage VSS. The first end of the transistor MN14 is coupled to the second end of the transistor MN13, and the second end of the transistor MN14 is coupled to the power ground voltage VSS.

In the present embodiment, the switches SW11 and SW12 are pull-high switches, the switch SW11 is coupled between the first output end O1 and the power operating voltage VDD that serves as a reference voltage, and the switch SW12 is coupled between the second output end O2 and the power reference voltage. The switch SW11 and the switch SW12 are turned on or turned off according to the logic operation results generated by the logic operation circuits 413 and 414. Here, the switch SW11 is constructed by the P-type transistor MP13, the switch SW12 is constructed by the P-type transistor MP14.

The logic operation circuit 413 includes a NOR gate NOR1, and the NOR gate NOR1 receives the inverted signal of the write-in signal WR and the bit data DI and performs a NOR logic operation on the inverted write-in signal WRB and the bit data DI to generate a logic operation result to control the switch SW11. The logic operation circuit 414 includes a NOR gate NOR2, and the NOR gate NOR2 receives the inverted signal of the write-in signal WRB and the inverted bit data DIB and performs a NOR logic operation on the inverted write-in signal WRB and the inverted bit data DIB to generate a logic operation result to control the switch SW12. The inverted write-in signal WRB is generated by the inverter INV1.

As to the overall operation, when there is no write-in operation on the bit data DI, the write-in signal WR is a logic low level signal. At this time, the switches SW11 and SW12 are turned on respectively according to the logic operation results of the logic operation circuits 413 and 414, and the first voltage V1 and the second voltage V2 are pulled up to be equal to the power operating voltage VDD. When the write-in operation of the bit data DI occurs, the write-in signal WR is a logic high level signal. For instance, if the bit data DI is equal to a logic high level, the switch SW11 stays turned on, and the switch SW12 is changed to be turned off; at the same time, the tri-state inverter 412 is enabled and changes the second voltage V2. Note that the change of the voltage value of the second voltage V2 generated on the second output end O2 is dominated by the tri-state inverter 412 following the action that the switch SW12 is turned off and the tri-state 412 is enabled. At this time, the second voltage V2 is determined according to whether the transistors MP12 and MN13 are turned on or not. That is, the voltage value of the second voltage V2 can be the result of performing the voltage division on the power operating voltage VDD according to the equivalent diodes of the transistors MP12 and MN13.

On the other hand, when the write-in operation of the bit data DI occurs, e.g., the bit data DI is equal to the logic low level, the switch SW12 stays turned on, and the switch SW11 is changed to be turned off; at the same time, the tri-state inverter 411 is enabled and changes the first voltage V1. Note that the change of the voltage value of the first voltage V1 generated on the first output end O1 is dominated by the tri-state inverter 411 following the action that the switch SW11 is turned off and the tri-state 411 is enabled. At the moment, the first voltage V1 is determined according to whether the transistors MP11 and MN11 are turned on or not. That is, the voltage value of the first voltage V1 can be the result of performing the voltage division on the power operating voltage VDD according to the equivalent diodes of the transistors MP11 and MN11.

The types of the transistors MP11 and MN11 mentioned above are complementary, and the types of the transistors MP12 and MP13 are complementary.

It should be mentioned that the electrical characteristics of the transistors MP11, MN11, MP12, and MN12 in the tri-state inverters 411 and 412 described herein may not be restricted, and the transistors in the first inverter and the second inverter of the data latch circuit may be designed according to the corresponding first and second voltages V1 and V2 connected thereto. For example, the transistors MP11 and MN11 can be designed respectively to have the electrical characteristics that are identical to those of the transistors M1 and M2 shown in FIG. 1, and the transistors MP12 and MN13 can be designed respectively to have the electrical characteristics that are identical to those of the transistors M3 and M4 shown in FIG. 1. In this case, when the process parameters vary, the voltage values of the first voltage V1 and the second voltage V2 generated and adjusted according to the tri-state inverters 411 and 412 can also be adjusted adaptively. Thus, the voltage provider 410 described in the embodiment of the invention can also generate the appropriate first voltage V1 or the appropriate second voltage V2 to maintain the validity of the data writing operation of the static memory cell even if the process drift occurs.

Figure 4B:
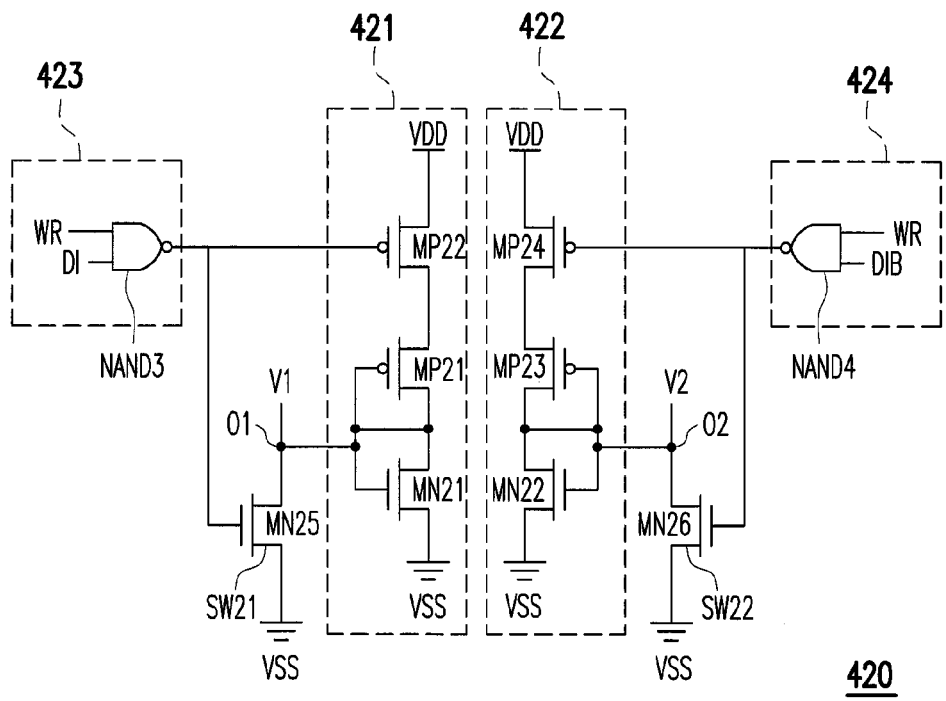
FIG. 4B is a schematic diagram illustrating a manner to implement a voltage provider 420 according to another embodiment of the invention.

FIG. 4B is a schematic diagram illustrating a manner to implement a voltage generator 420 according to another embodiment of the invention. The voltage provider 420 includes a tri-state inverter 421, a tri-state inverter 422, a switch SW21, a switch 22, a logic operation circuit 423, and a logic operation circuit 424. The difference between this embodiment and the previous embodiment shown in FIG. 4A is that the first voltage V1 and the second voltage V2 generated by the voltage generator 420 serve to provide the reference ground voltages of the inverters of the data latch circuit, respectively.

The tri-state inverter 421 includes transistors MP21, MP22, and MN21. The first end and the second end of the transistor MP22 are coupled to the power operating voltage VDD and the first end of the transistor MP21, respectively, and the control end of the transistor MP22 is coupled to the output end of the logic operation circuit 423. The second end of the transistor MP21 and the first end of the transistor MN21 are coupled to each other and construct the output end of the tri-state inverter 421, and the control end of the transistor MP21 and the control end of the transistor MN21 are coupled to each other and construct the input end of the tri-state inverter 421. Here, the input end of the tri-state inverter 421 is coupled to the output end of the tri-state inverter 421 and the first output end O1. Besides, the second end of the transistor MN21 is coupled to the power reference ground voltage VSS.

The tri-state inverter 422 includes transistors MP23, MP24 and MN22. The first end and the second end of the transistor MP24 are coupled to the power operating voltage VDD and the first end of the transistor MP23, respectively, and the control end of the transistor MP24 is coupled to the output end of the logic operation circuit 424. The second end of the transistor MP23 and the first end of the transistor MN22 are coupled to each other and construct the output end of the tri-state inverter 422, and the control end of the transistor MP23 and the control end of the transistor MN22 are coupled to each other and construct the input end of the tri-state inverter 422. Here, the input end of the tri-state inverter 422 is coupled to the output end of the tri-state inverter 422 and the second output end O2. Besides, the second end of the transistor MN22 is coupled to the power reference ground voltage VSS.

The switches SW21 and SW22 are pull-low switches and are constructed by the transistors MN25 and MN26, respectively. The switches SW21 and SW22 are turned on or turned off according to the logic operation results generated by the logic operation circuits 423 and 424 respectively. When the switch SW21 is turned on, the first voltage V1 of the first output end O1 is pulled low to be equal to the power reference ground voltage VSS, and when the switch SW22 is turned on, the second voltage V2 of the second output end O2 is pulled low to be equal to the power reference ground voltage VSS.

The logic operation circuits 423 and 424 respectively include NAND gates NAND3 and NAND4, the logic operation circuit 423 performs a NAND operation on the write-in signal WR and the bit data DI, and the logic operation circuit 424 performs a NAND operation on the write-in signal WR and the inverted bit data DIB.

The operation of the voltage provider 420 is similar to that of the voltage provider 410 described in the previous embodiment, and therefore no further description is provided hereinafter. Note that the transistors MP21 and MN21 can be respectively designed to have the electrical characteristics which are identical to the electrical characteristics of the transistors M1 and M2 depicted in FIG. 1, and the transistors MP23 and MN22 can be respectively designed to have the electrical characteristics which are identical to the electrical characteristics of the transistors M3 and M4 depicted in FIG. 1.

Figure 5A:
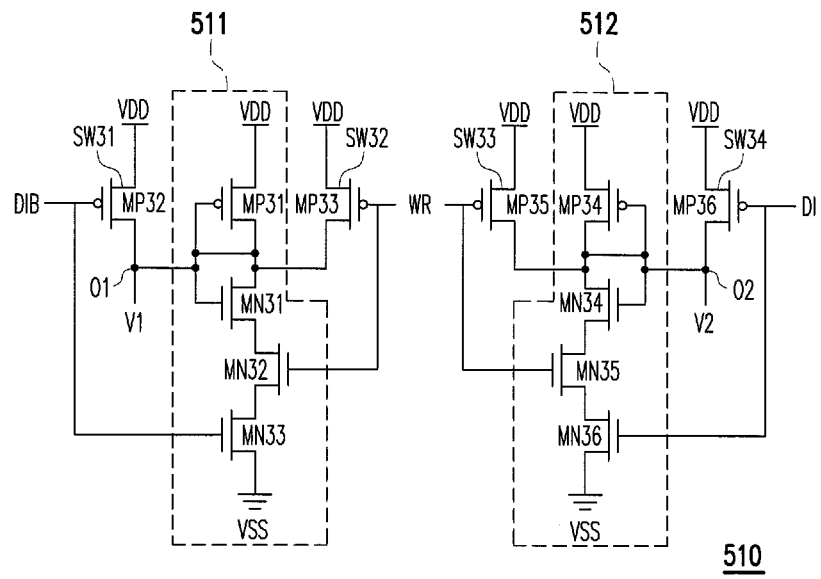
FIG. 5A is a schematic diagram illustrating a manner to implement a voltage provider 510 according to yet another embodiment of the invention.

FIG. 5A is a schematic diagram illustrating a manner to implement a voltage generator 510 according to yet another embodiment of the invention. The voltage provider 510 includes tri-state inverters 511 and 512 and switches SW31 to SW34. The tri-state inverter 511 includes transistors MP31 and MN31 to MN33. The control end of the transistor MP31 and the control end of the transistor MN31 are coupled to each other to construct the input end of the tri-state inverter 511, and the second end of the transistor MP31 and the first end of the transistor MN31 are coupled to each other to construct the output end of the tri-state inverter 511. The input end and the output end of the tri-state inverter 511 are coupled to each other and are coupled to the first output end O1. Here, the first output end O1 serves to provide the first voltage V1 as an operating voltage of one of the inverters of the corresponding data latch circuit. Besides, the first end of the transistor MP31 is coupled to the power operating voltage VDD, and the transistors MN32 and MN33 are connected serially between the second end of the transistor MN31 and the power reference ground voltage VSS. The transistors MN32 and MN33 are controlled by the write-in signal WR and the inverted bit data DIB, respectively.

Furthermore, the switches SW31 and SW32 constructed respectively by the transistors MP32 and MP33 are pull-high switches; the switches SW31 and SW32 are connected serially between the power operating voltage VDD and the first output end O1 and are controlled respectively by the inverted bit data DIB and the write-in signal WR, such that the switches SW31 and SW32 are turned on or off.

The tri-state inverter 512 includes transistors MP34 and MN34 to MN36. The control ends of the transistors MP34 and MN34 are coupled to each other to construct the input end of the tri-state inverter 512, and the second end of the transistor MP34 and the first end of the transistor MN34 are coupled to each other to construct the output end of the tri-state inverter 512. The input end and the output end of the tri-state inverter 512 are coupled to each other and are coupled to the second output end O2, and the second output end O2 serves to provide the second voltage V2 as the corresponding operating voltage of one of the inverters of the data latch circuit. Besides, the first end of the transistor MP34 is coupled to the power operating voltage VDD, and the transistors MN35 and MN36 are connected serially between the second end of the transistor MN34 and the power reference ground voltage VSS. The transistors MN35 and MN36 are controlled by the write-in signal WR and the bit data DI, respectively.

The switches SW33 and SW34 constructed respectively by the transistors MP35 and MP36 are pull-high switches; the switches SW33 and SW34 are connected serially between the power operating voltage VDD and the second output end O2 and are controlled respectively by the write-in signal WR and the bit data DI, such that the switches SW33 and SW34 are turned on or off.

As to the overall operation, when the write-in signal WR indicates that the bit data writing operation is not performed on the static memory cell, the switches SW32 and SW33 are turned on, such that the first voltage V1 of the first output end O1 and the second voltage V2 of the second output end O2 are pulled up to the power operating voltage VDD. When the write-in signal WR indicates that the bit data writing operation is performed on the static memory cell, the write-in signal WR is a logic high level signal, and the switches SW32 and SW33 are turned off; when the written bit data DI is at a logic high level, the switch SW31 is turned on, the first voltage V1 of the first output end O1 stays equal to the power operating voltage VDD, the switch SW34 is turned off, and the second output voltage V2 is thus controlled by the tri-state inverter 512. At the same time, the transistors MN35 and MN36 are turned on, such that a voltage that is lower than the power operating voltage VDD is generated on the output end of the tri-state inverter 512. Namely, the second voltage V2 can be properly decreased to some extent.

By contrast, when the written bit data DI is at a logic low level, the switch SW31 is turned off; at this time, the first voltage V1 is controlled by the tri-state inverter 511, the transistors MN32 and MN33 are turned on, and a voltage that is lower than the power operating voltage VDD is thus generated at the output end of the tri-state inverter 511; that is to say, the first voltage V1 can be properly decreased to some extent.

Figure 5B:
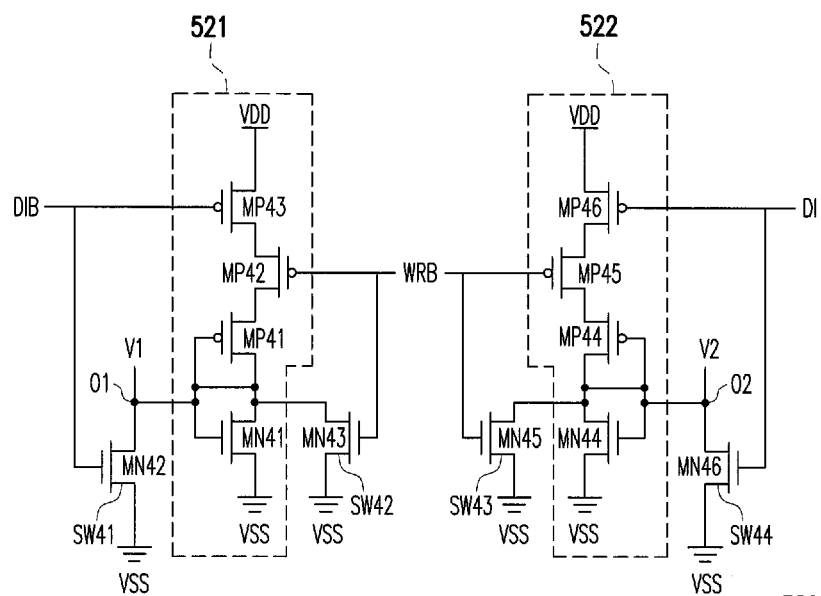
FIG. 5B is a schematic diagram illustrating a manner to implement a voltage provider 520 according to yet another embodiment of the invention.

FIG. 5B is a schematic diagram illustrating a manner to implement a voltage generator 520 according to yet another embodiment of the invention. The voltage generator 520 includes tri-state inverters 521 and 522 and switches SW41 to SW44. The tri-state inverter 521 includes transistors MN41 and MP41 to MP43. The control end of the transistor MP41 and the control end of the transistor MN41 are coupled to each other to construct the input end of the tri-state inverter 521, and the second end of the transistor MP41 and the first end of the transistor MN41 are coupled to each other to construct the output end of the tri-state inverter 521. The input end and the output end of the tri-state inverter 521 are coupled to each other and are coupled to the first output end O1. Here, the first output end O1 serves to provide the first voltage V1 as a corresponding reference ground voltage of one of the inverters of the data latch circuit. Besides, the second end of the transistor MN41 is coupled to the power reference ground voltage VSS, and the transistors MP41 to MP43 are connected serially between the first end of the transistor MN41 and the power operating voltage VDD. The transistors MP42 and MP43 are controlled by the inverted write-in signal WRB and the inverted bit data DIB, respectively.

Furthermore, the switches SW41 and SW42 constructed respectively by the transistors MN42 and MN43 are pull-low switches; the switches SW41 and SW42 are connected serially between the reference ground voltage VSS and the first output end O1 and are controlled respectively by the inverted bit data DIB and the inverted write-in signal WRB, such that the switches SW41 and SW42 are turned on or off.

The tri-state inverter 522 includes transistors MN44 and MP44 to MP46. The control ends of the transistors MN44 and MP44 are coupled to each other to construct the input end of the tri-state inverter 522, and the second end of the transistor MP44 and the first end of the transistor MN44 are coupled to each other to construct the output end of the tri-state inverter 522. The input end and the output end of the tri-state inverter 522 are coupled to each other and are coupled to the second output end O2. Here, the second output end O2 serves to provide the second voltage V2 as the corresponding reference ground voltage of one of the inverters of the data latch circuit. Besides, the second end of the transistor MN44 is coupled to the power reference ground voltage VSS, and the transistors MP44 to MP46 are connected serially between the first end of the transistor MN44 and the power operating voltage VDD. The transistors MP45 and MP46 are controlled by the inverted write-in signal WRB and the bit data DI, respectively.

The switches SW43 and SW44 constructed respectively by the transistors MN45 and MN46 are pull-low switches; the switches SW43 and SW44 are connected serially between the power reference ground voltage VSS and the second output end O2 and are controlled respectively by the inverted write-in signal WRB and the bit data DI to be turned on or off.

The voltage provider 520 depicted in FIG. 5B and the voltage provider 510 are complementary. Since the detailed operation of the voltage provider 520 is similar to that of the voltage provider 510, no further description is given hereinafter.

Figure 6A:
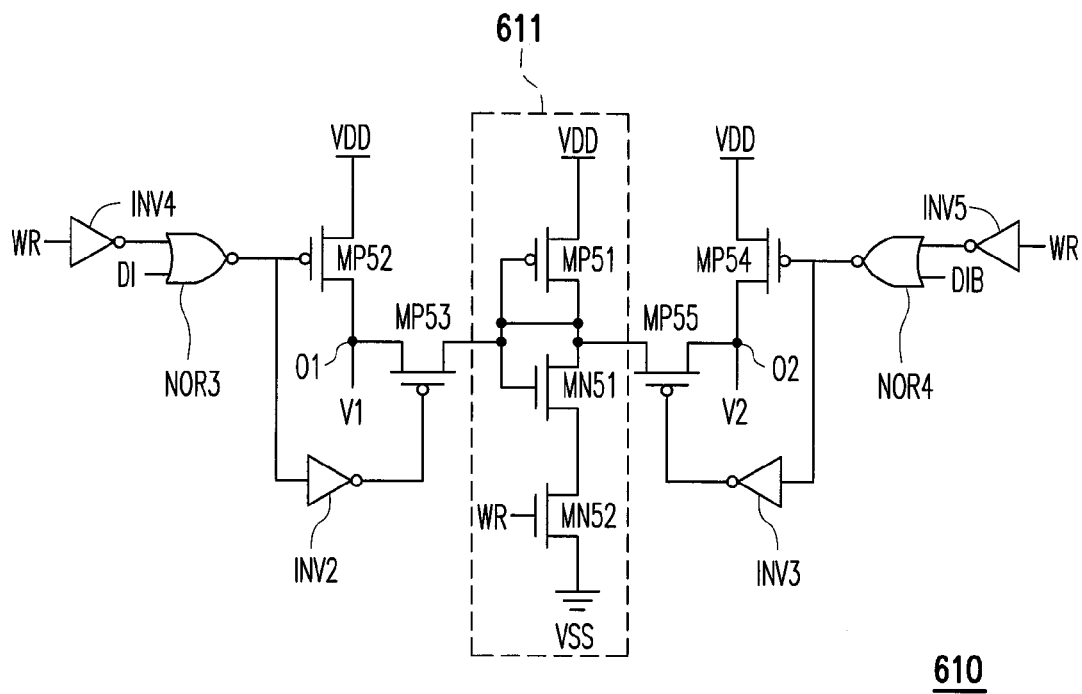
FIG. 6A is a schematic diagram illustrating a manner to implement a voltage provider 610 according to yet another embodiment of the invention.

FIG. 6A is a schematic diagram illustrating a manner to implement a voltage generator 610 according to yet another embodiment of the invention. The voltage generator 610 includes a tri-state inverter 611, multiple switches constructed by transistors MP52 to MP55 respectively, inverters INV2 to INV5, and NOR gates NOR3 to NOR4. The tri-state inverter 611 includes transistors MP51, MN51, and MN52. The first end of the transistor MP51 receives the power operating voltage VDD, the second end of the transistor MP51 and the first end of the transistor MN51 are coupled to each other to construct the output end of the tri-state inverter 611, and the control end of the transistor MP51 and the control end of the transistor MN51 are coupled to each other to construct the input end of the tri-state inverter 611. Besides, the input end and the output end of the tri-state inverter 611 are coupled to each other. The control end of the transistor MN52 constructs the control end of the tri-state inverter 611 and receives the write-in signal WR. The transistors MN52 are connected serially between the second end of the transistor MN51 and the power reference ground voltage VSS.

The switch constructed by the transistor MP53 is coupled between the input end of the tri-state inverter 611 and the first output end O1 and is turned on or off according to the output of the inverter INV2. The switch constructed by the transistor MP55 is coupled between the output end of the tri-state inverter 611 and the second output end O2 and is turned on or off according to the output of the inverter INV3. Besides, the switch constructed by the transistors MP52 and MP54 is a pull-high switch, the transistor MP52 is coupled between the first output end O1 and the power operating voltage VDD, and the transistor MP54 is coupled between the second output end O2 and the power operating voltage VDD. The first output end O1 and the second output end O2 provide the first voltage V1 and the second voltage V2 respectively as the operating voltages of the inverters of the data latch circuit.

The two input ends of the NOR gate NOR3 are coupled to the output end of the inverter INV4 and the bit data DI, respectively, and the output end of the NOR gate NOR3 is coupled to the control end of the transistor MP52 and the input end of the inverter INV2. The two input ends of the NOR gate NOR4 are coupled to the output end of the inverter INV5 and the inverted bit data DIB, respectively, and the output end of the NOR gate NOR4 is coupled to the control end of the transistor MP54 and the input end of the inverter INV3. The input ends of the inverters INV4 and INV5 receive the write-in signal WR.

As to the overall operation, when the write-in signal WR indicates that the bit data writing operation is not performed on the static memory cell, the write-in signal WR is a logic low level signal. The transistors MP52 and MP54 are turned on, such that the first voltage V1 of the first output end O1 and the second voltage V2 of the second output end O2 are pulled high to the power operating voltage VDD, and the transistors MP53 and MP55 are turned off. When the write-in signal WR indicates that the bit data writing operation is performed on the static memory cell, the write-in signal WR is a logic high level signal; when the bit data DI is at a logic high level, the transistors MP52 and MP55 are turned on, and the transistors MP53 and MP54 are turned off. The first voltage V1 of the first output end O1 is kept to be equal to the power operating voltage VDD, and the second voltage V2 of the second output end O2 is generated by the tri-state inverter 611 and has a voltage value lower than the power operating voltage VDD.

By contrast, when the write-in signal WR indicates that the bit data writing operation is performed on the static memory cell, and the bit data DI is at a logic low level, the transistors MP53 and MP54 are turned on, and the transistors MP52 and MP55 are turned off. The second voltage V2 of the second output end O2 is equal to the power operating voltage VDD, and the first voltage V1 of the first output end O1 is generated by the tri-state inverter 611 and has a voltage value lower than the power operating voltage VDD.

Figure 6B:
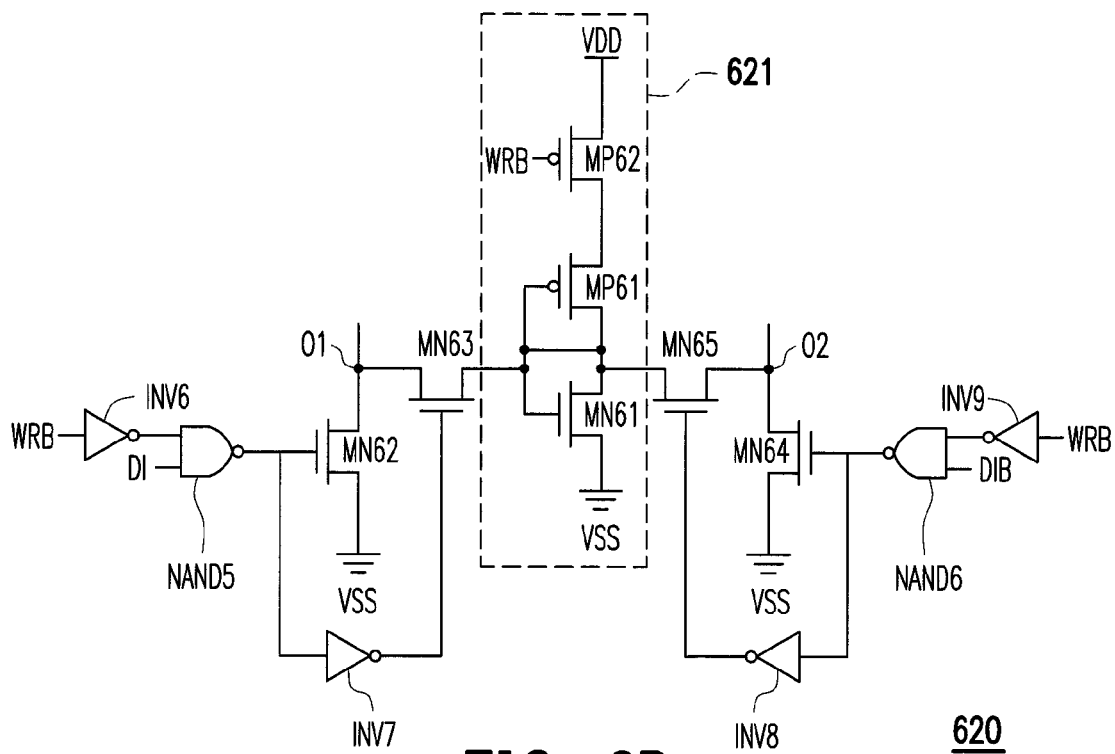
FIG. 6B is a schematic diagram illustrating a manner to implement a voltage provider 620 according to yet another embodiment of the invention.

FIG. 6B is a schematic diagram illustrating a manner to implement a voltage generator 620 according to yet another embodiment of the invention. The voltage generator 620 includes a tri-state inverter 621 constructed by transistors MP61, MP62, and MN61, multiple switches constructed by transistors MP62 to MP65 respectively, inverters INV6 to INV9, and NAND gates NAND5 to NAND6. The voltage generator 620 and the voltage generator 610 are complementary, and the circuit coupling manners and the operations of the voltage generator 620 and the voltage generator 610 are complementary; therefore, no relevant details are provided hereinafter.

Figure 7A:
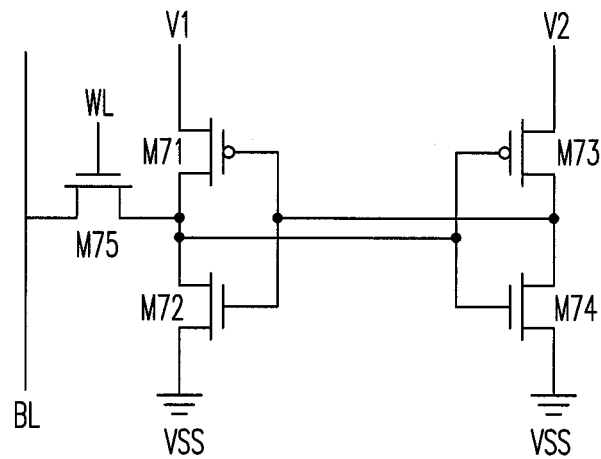
FIG. 7A and FIG. 7B are schematic diagrams respectively illustrating different manners to implement a data latch circuit according to the embodiments of the invention.
Figure 7B:
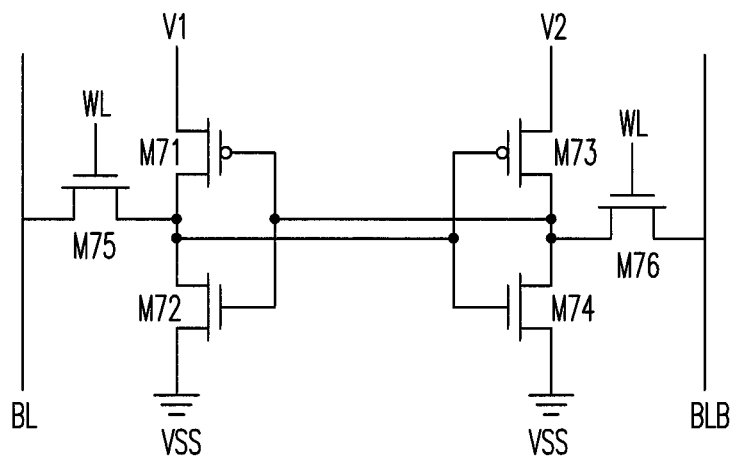

FIG. 7A and FIG. 7B are schematic diagrams illustrating different manners to implement a data latch circuit according to an embodiment of the invention. The data latch circuit 710 illustrated in FIG. 7A is a 5T (five transistors) circuit where data is written through single terminal. The data latch circuit 710 includes transistors M71 to M75. The transistors M71 and M72 construct the first inverter, the transistors M73 and M74 construct the second inverter, and the transistor M75 is a switch. The first end of the transistor M75 is coupled to the bit line BL, the second end of the transistor M75 is coupled to the output end of the first inverter, and the control end of the transistor M75 is coupled to the word line WL and is turned on or off according to the word line signal of the word line WL.

The data latch circuit 720 illustrated in FIG. 7B is a 6T (six transistors) circuit where data is written through dual terminals. The difference between the data latch circuit 720 and the data latch circuit 710 is that the data latch circuit 720 still includes the transistor M76. The first end of the transistor M75 is coupled to the first bit line BL, the second end of the transistor M75 is coupled to the output end of the first inverter constructed by the transistors M71 and M72, and the control end of the transistor M75 is coupled to the word line WL and is turned on or off according to the word line signal of the word line WL. The first end of the transistor M76 is coupled to the second bit line BLB, the second end of the transistor M76 is coupled to the output end of the second inverter constructed by the transistors M73 and M74, and the control end of the transistor M76 is coupled to the word line WL and is turned on or off according to the word line signal of the word line WL.

It should be mentioned that the data latch circuit provided in the embodiment of the invention is not limited to the data latch circuits 710 and 720 mentioned above and can be implemented by various kinds of different circuits as long as the circuit includes two inverters coupled to each other.

Figure 8:
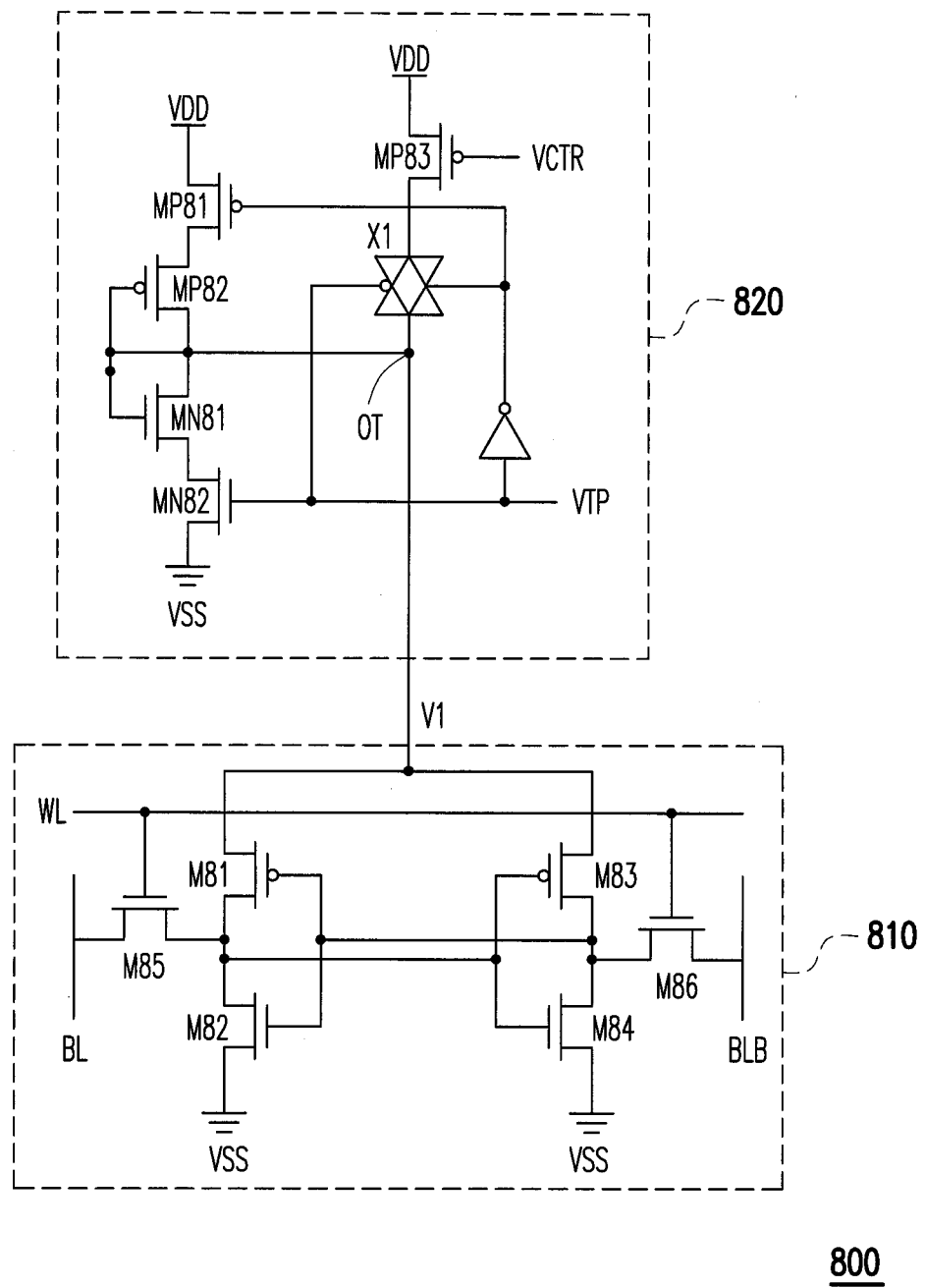
FIG. 8 is a schematic diagram illustrating a static memory cell 800 according to yet another embodiment of the invention.

FIG. 8 is a schematic diagram illustrating a static memory cell 800 according to yet another embodiment of the invention. The static memory cell 800 includes a data latch circuit 810 and a voltage provider 820. The data latch circuit 810 is coupled to the voltage provider 820, and the data latch circuit 810 is configured to store the bit data. The data latch circuit 810 includes a first inverter constructed by the transistors M81 and M82 and a second inverter constructed by the transistors M83 and M84. The first inverter and the second inverter are coupled to each other. The first inverter and the second inverter also receive the output voltage (i.e., the first voltage V1) as the operating voltages. The data latch circuit 810 further includes the transistors M85 and M86 and is coupled to the bit lines BL and BLB through the transistors M85 and M86, respectively. The control ends of the transistors M85 and M86 are coupled to the word line WL.

The voltage provider is coupled to the data latch circuit and provides the output voltage; the voltage provider includes a tri-state inverter and a switch. The tri-state inverter is constructed by transistors MP81, MP82, MN81, and MN82. The output end of the tri-state inverter is coupled to the input end of the tri-state inverter, such that the output end of the tri-state inverter is coupled to the output end OT. The output end OT provides the first voltage V1 to the data latch circuit 810. The tri-state inverter mentioned above is controlled by the voltage providing enabling signal VTP.

The switch is constructed by the transistor MP83 and the transmission gate X1. The first end of the transistor MP83 receives the power operating voltage VDD, and the control end of the transistor MP83 receives the control signal VCTR. The transmission gate X1 is connected serially between the second end of the transistor MP83 and the data latch circuit 810 and is turned on or off according to whether the data latch circuit 810 performs the data writing operation or not.

In the present embodiment, whether the data latch circuit 810 performs the data writing operation or not can be indicated by the voltage providing enabling signal VTP and the control signal VCTR. When the data latch circuit 810 performs the data writing operation, the voltage providing enabling signal VTP and the control signal VCTR can be at a logic high level and a logic low level, respectively. That is to say, when the data latch circuit 810 performs the data writing operation, the transmission gate X1 is turned off, and the tri-state inverter constructed by the transistors MP81, MP82, MN81, and MN82 is operating. The tri-state inverter can provide an output voltage V1 that is lower than the power operating voltage VDD to be the operating voltage of the data latch circuit 810 through the cascaded transistors MP82 and MN81.

On the other hand, when the data latch circuit 810 does not perform the data writing operation, both the voltage providing enabling signal VTP and the control signal VCTR can be at a logic low level, the tri-state inverter is disabled, and the power operating voltage VDD is transferred to the data latch circuit 810 through the turned-on transmission gate X1 and serves as the operating voltage.

Figure 9A:
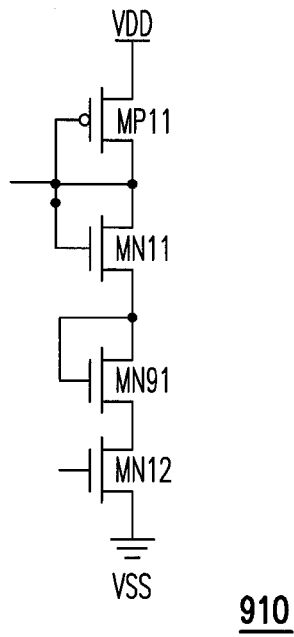
FIG. 9A, FIG. 9B and FIG. 9C are schematic diagrams respectively illustrating different embodiments of a tri-state inverter.
Figure 9B:
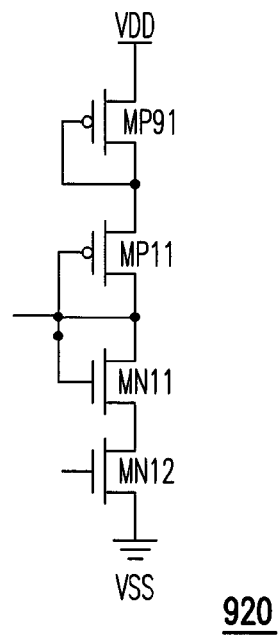
Figure 9C:
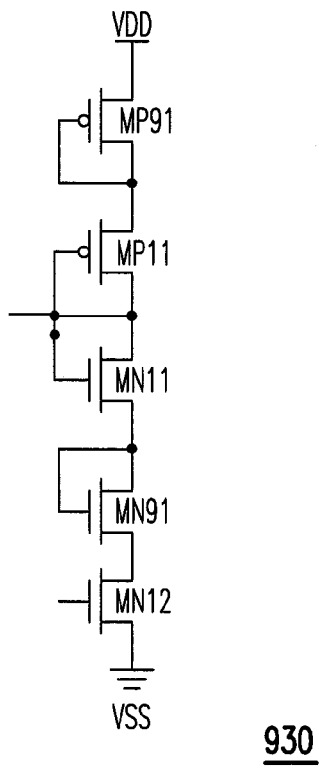

FIG. 9A to FIG. 9C are schematic diagrams illustrating different embodiments of the tri-state inverter. Compared to the tri-state inverter 411 illustrated in FIG. 4A, the tri-state inverter 910 depicted in FIG. 9A further includes the transistor MN91. Here, the first end and the control end of the transistor MN91 are coupled to each other and are coupled to the second end of the transistor MN11. The second end of the transistor MN91 is coupled to the first end of the transistor MN12.

The tri-state inverter 920 depicted in FIG. 9B further includes the transistor MP91. Here, the first end and the control end of the transistor MP91 are coupled to each other and are coupled to the first end of the transistor MP11. The second end of the transistor MP91 is coupled to the power operating voltage VDD.

The tri-state inverter 920 depicted in FIG. 9C includes the transistors MN91 and MP91 simultaneously; the coupling manners of the transistors MN91 and MP91 are identical to those depicted in FIG. 9A and FIG. 9B, and thus further descriptions are omitted hereinafter. It can be learned from FIG. 9A to FIG. 9C that a tri-state inverter provided in an embodiment of the invention can be designed by constructing a circuit architecture that is similar to that of the data latch circuit. Accordingly, the output voltage provided by the tri-state inverter can be adjusted in accordance with the variations in the electrical parameters of the elements in the data latch circuit because the process drift may occur. Thus, the voltage provider described in an embodiment of the invention can adaptively provide an appropriate output voltage as the operating voltage of the data latch circuit.

To sum up, according to an embodiment of the invention, the power voltage received by one of the first and second inverters of the data latch circuit of the static memory cell is adjusted according to the bit data that is written into the static memory cell, and the process of writing the bit data into the static memory cell may be expedited effectively by adjusting the power voltage. Besides, the data writing efficiency of the static memory cells provided in an embodiment of the invention can be maintained even if the process drift occurs Although the invention has been described with reference to the above embodiments, it will be apparent to one of the ordinary skill in the art that modifications to the described embodiments may be made without departing from the spirit of the invention. Accordingly, the scope of the invention is defined by the attached claims not by the above detailed descriptions.

What is claimed is:

1. A static memory cell comprising:
    a data latch circuit configured to store a bit data, the data latch circuit comprising a first inverter and a second inverter coupled to each other, the first inverter and the second inverter respectively receiving a first voltage and a second voltage as power voltages; and
    a voltage provider coupled to the data latch circuit to provide the first voltage and the second voltage to the data latch circuit,
    wherein when the bit data is written into the data latch circuit, the voltage provider adjusts a voltage value of the first voltage or a voltage value of the second voltage according to the bit data,
    wherein the voltage provider comprises:
    a first tri-state inverter, an output end of the first tri-state inverter being coupled to an input end of the first tri-state inverter, such that the output end of the first tri-state inverter being coupled to a first output end, and the first output end providing the first voltage to the first inverter; and
    a second tri-state inverter, an output end of the second tri-state inverter being coupled to an input end of the second tri-state inverter, such that the output end of the second tri-state inverter being coupled to a second output end, and the second output end providing the second voltage to the second inverter,
    wherein when the bit data is written into the data latch circuit, one of the first tri-state inverter and the second tri-state inverter is enabled according to the bit data.

2. The static memory cell according to claim 1, wherein the voltage provider further comprises:
    a first switch coupled between the first output end and a reference voltage, the first switch being turned on or off according to the bit data and a write-in signal; and
    a second switch coupled between the second output end and the reference voltage, the second switch being turned on or off according to the bit data and the write-in signal.

3. The static memory cell according to claim 2, wherein first voltage and the second voltage are operating voltages of the first inverter and the second inverter, respectively, and the reference voltage is a power operating voltage, wherein when the first tri-state inverter is enabled, the voltage value of the first voltage is decreased, and when the second tri-state inverter is enabled, the voltage value of the second voltage is decreased.

4. The static memory cell according to claim 2, wherein the first voltage and the second voltage are reference ground voltages of the first inverter and the second inverter, respectively, the reference voltage is a power ground voltage, wherein when the first tri-state inverter is enabled, the voltage value of the first voltage is increased, and when the second tri-state inverter is enabled, the voltage value of the second voltage is increased.

5. The static memory cell according to claim 1, wherein each of the first tri-state inverter and the tri-state second inverter comprises:
    a first transistor including a first end, a second end, and a control end, the first end of the first transistor being coupled to a first reference voltage, the control end and the second end of the first transistor being coupled to each other;
    a second transistor including a first end, a second end, and a control end, the first end of the second transistor being coupled to the second end of the first transistor, the control end of the second transistor being coupled to the first end of the second transistor; and
    a third transistor including a first end, a second end, and a control end, the first end of the third transistor being coupled to the second end of the second transistor, the second end of the third transistor being coupled to a second reference voltage, the control end of the third transistor being coupled to a logic operation result,
    wherein the logic operation result is generated by performing logic operation according to the write-in signal and the bit data, and types of the first transistor and the second transistor are complementary.

6. The static memory cell according to claim 5, wherein each of the first tri-state inverter and the second tri-state inverter further comprises:
    a fourth transistor including a first end, a second end, and a control end, wherein the first end and the control end of the fourth transistor are coupled to each other, the fourth transistor is cascaded between the first reference voltage and the first end of the first transistor, or the fourth transistor is cascaded between the second end of the second transistor and the first end of the third transistor.

7. The static memory cell according to claim 5, wherein each of the first tri-state inverter and the second tri-state inverter further comprises:
    a fourth transistor including a first end, a second end, and a control end, wherein the first end and the control end of the fourth transistor are coupled to each other, and the fourth transistor is cascaded between the first reference voltage and the first end of the first transistor; and
    a fifth transistor including a first end, a second end, and a control end, wherein the first end and the control end of the fifth transistor are coupled to each other, and the fifth transistor is cascaded between the second end of the second transistor and the first end of the third transistor.

8. The static memory cell according to claim 5, wherein the voltage provider further comprises:
    a logic operation circuit performing the logic operation on the write-in signal and the bit data and performing the logic operation on the write-in signal and inverted bit data to generate the logic operation result.

9. The static memory cell according to claim 1, wherein the first tri-state inverter comprises:
- a first transistor including a first end, a second end, and a control end, the first end of the first transistor being coupled to a first reference voltage, the control end and the second end of the first transistor being coupled to each other;
- a second transistor including a first end, a second end, and a control end, the first end of the second transistor being coupled to the second end of the first transistor, the control end of the second transistor being coupled to the first end of the second transistor;
- a third transistor including a first end, a second end, and a control end, the first end of the third transistor being coupled to the second end of the second transistor, the control end of the third transistor receiving a write-in signal; and
- a fourth transistor including a first end, a second end, and a control end, the first end of the fourth transistor being coupled to the second end of the third transistor, the second end of the fourth transistor being coupled to a second reference voltage, the control end of the fourth transistor receiving inverted bit data;

the second tri-state inverter comprising:
- a fifth transistor including a first end, a second end, and a control end, the first end of the fifth transistor being coupled to the first reference voltage, the control end and the second end of the fifth transistor being coupled to each other;
- a sixth transistor including a first end, a second end and a control end, the first end of the sixth transistor being coupled to the second end of the fifth transistor, the control end of the sixth transistor being coupled to the first end of the sixth transistor;
- a seventh transistor including a first end, a second end, and a control end, the first end of the seventh transistor being coupled to the second end of the sixth transistor, the control end of the seventh transistor receiving the write-in signal; and
- an eighth transistor including a first end, a second end, and a control end, the first end of the eighth transistor being coupled to the second end of the seventh transistor, the second end of the eighth transistor being coupled to the second reference voltage, the control end of the eighth transistor receives the bit data;

wherein one of the first reference voltage and the second reference voltage is a power operating voltage, the other of the first reference voltage and the second reference voltage is a power ground voltage, types of the first transistor and the second transistor are complementary, and types of the fifth transistor and the sixth transistor are complementary.

10. The static memory cell according to claim 1, wherein the input end of the first inverter is coupled to the output end of the second inverter, and the output end of the first inverter is coupled to the input end of the second inverter.

11. The static memory cell according to claim 10, wherein the data latch circuit further comprises:
- a first switch coupled between a first bit line and the output end of the first inverter, the first switch being turned on or off according to a word line signal.

12. The static memory cell according to claim 11, wherein the data latch circuit further comprises:
- a second switch coupled between a second bit line and the output end of the second inverter, the second switch being turned on or off according to the word line signal.

13. A static memory cell comprising:
- a data latch circuit configured to store a bit data, the data latch circuit comprising a first inverter and a second inverter coupled to each other, the first inverter and the second inverter respectively receiving a first voltage and a second voltage as power voltages; and
- a voltage provider coupled to the data latch circuit to provide the first voltage and the second voltage to the data latch circuit, wherein when the bit data is written into the data latch circuit, the voltage provider adjusts a voltage value of the first voltage or a voltage value of the second voltage according to the bit data, wherein the voltage provider comprises:
- a tri-state inverter, the input end of the tri-state inverter being coupled to the output end of the tri-state inverter, the tri-state inverter being disabled or enabled according to a write-in signal and the bit data;
- a first switch cascaded between the output end of the tri-state inverter and a first output end, the first switch being controlled by a first logic operation result, such that the first switch is turned on or off; and
- a second switch cascaded between the output end of the tri-state inverter and a second output end, the second switch being controlled by a second logic operation result, such that the second switch is turned on or off, wherein the first switch and the second switch are not turned on simultaneously, and the first and the second logic operation results are generated according to the write-in signal and the bit data.

14. The static memory cell according to claim 13, wherein the voltage provider further comprises:
- a third switch coupled between the first output end and a reference voltage, the third switch being turned on or off according to the bit data and the write-in signal; and
- a fourth switch coupled between the second output end and the reference voltage, the fourth switch being turned on or off according to the bit data and the write-in signal.

15. The static memory cell according to claim 13, wherein the first voltage and the second voltage are operating voltages of the first inverter and the second inverter, respectively, and the reference voltage is a power operating voltage, wherein when the first switch is turned on, the voltage value of the first voltage is decreased, and when the second switch is turned on, the voltage value of the second voltage is decreased.

16. The static memory cell according to claim 13, wherein the first voltage and the second voltage are the reference ground voltages of the first inverter and the second inverter respectively, the reference voltage is a power ground voltage, wherein, when the first switch is turned on, the voltage value of the first voltage is increased, when the second switch is turned on, the voltage value of the second voltage is increased.

* * * * *